US008674660B2

(12) United States Patent  
Yamada et al.

(10) Patent No.: US 8,674,660 B2  
(45) Date of Patent: Mar. 18, 2014

(54) ELECTRIC TOOL BATTERY

(75) Inventors: Toru Yamada, Anjo (JP); Hitoshi Suzuki, Anjo (JP)

(73) Assignee: Makita Corporation, Aichi (JP)

( * ) Notice: Subject to any disclaimer, the term of this patent is extended or adjusted under 35 U.S.C. 154(b) by 126 days.

(21) Appl. No.: 13/180,150

(22) Filed: Jul. 11, 2011

(65) Prior Publication Data

US 2012/0013307 A1    Jan. 19, 2012

(30) Foreign Application Priority Data

Jul. 15, 2010 (JP) ................................ 2010-160444

(51) Int. Cl.  
*H02J 7/00* (2006.01)

(52) U.S. Cl.  
USPC ........................... 320/134; 320/135; 320/136

(58) Field of Classification Search  
USPC ................................................ 320/134–136  
See application file for complete search history.

(56) References Cited

U.S. PATENT DOCUMENTS

| | | | |
|---|---|---|---|
| 4,024,415 A * | 5/1977 | Matsuura | 327/85 |
| 5,705,911 A * | 1/1998 | Tamai | 320/134 |
| 6,992,463 B2 * | 1/2006 | Yoshio | 320/134 |
| 2007/0170889 A1 | 7/2007 | Ishikawa et al. | |
| 2008/0152993 A1 | 6/2008 | Seiler et al. | |
| 2008/0254356 A1 | 10/2008 | Liersch et al. | |

FOREIGN PATENT DOCUMENTS

WO    WO 2008/106641 A1    9/2008

OTHER PUBLICATIONS

Oct. 21, 2011 European Search Report issued in European Application No. EP 11 17 3651.8.

* cited by examiner

*Primary Examiner* — Samuel Berhanu  
(74) *Attorney, Agent, or Firm* — Oliff PLC

(57) ABSTRACT

In an electric tool battery, even in a case where poor connection or the like is generated in the wiring between one voltage monitoring element and the cells, it is possible to monitor the voltages of the cells by another voltage monitoring element, so that it is possible to achieve an improvement in terms of the reliability of the electric tool battery against overcharge etc. The electric tool battery includes a plurality of cells connected in series and a plurality of voltage monitoring elements capable of doubly monitoring of the voltages of the individual cells at the time of charging and discharging, and a lead plate electrically connecting an electrode of the cell and an electrode of the cell has voltage signal extraction portions respectively corresponding to the voltage monitoring elements with the voltage signal extraction portions and the voltage monitoring elements being respectively connected to each other by different conductors.

8 Claims, 7 Drawing Sheets

ELECTRIC TOOL BATTERY

This application claims priority to Japanese patent application serial number 2010-160444, the contents of which are incorporated herein by reference.

BACKGROUND OF THE INVENTION

1. Field of the Invention

The present invention relates to an electric tool battery provided with a plurality of cells connected in series and configured to be capable of multiple monitoring of the respective voltages of the individual cells by a plurality of voltage monitoring elements at the time of charging and discharging.

2. Description of the Related Art

As shown in FIG. 6, in an electric tool battery 100, in order to prevent overcharge of cells S1 through Sn, the voltages of the individual cells S1 through Sn are doubly monitored by two voltage monitoring elements 101 and 102. Thus, if one voltage monitoring element is out of order, the other voltage monitoring element operates to prevent overcharge or the like. In FIG. 6, the voltage monitoring element for monitoring the cells other than the cell S1, i.e., the cells S2 through Sn, is omitted.

FIG. 7 is a schematic perspective view of a specific wiring structure for guiding the connection portion between the negative electrode of the cell S1 and the positive electrode of the cell S2 to the two voltage monitoring elements 101 and 102. The negative electrode of the cell S1 and the positive electrode of the cell S2 are electrically connected to each other by a lead plate 104, and a voltage signal extraction portion 104v in the form of a band plate is formed at the center of the upper side of the lead plate 104 so as to extend upwardly. And, the upper end portion of the voltage signal extraction portion 104v is connected to a terminal 105t of a board 105, which is provided with the voltage monitoring elements 101 and 102. Further, the terminal 105t of the board 105 and the voltage monitoring elements 101 and 102 are electrically connected to each other by a conductor 107 printed on the board 105.

FIG. 8 shows another electric tool battery 110, which is provided with a lead plate 114 connecting the negative electrodes of two cells S and the positive electrodes of two cells S. At the center of the lead plate 114, there is formed a voltage signal extraction portion 114v, which is electrically connected to a terminal (not shown) of a board 115, to which voltage monitoring elements (not shown) are mounted, by a signal wire 114r.

In the above-described electric tool batteries 100 and 110, the lead plate 104, 114 connected to the electrodes of the cells S and the board 105, 115 provided with the two voltage monitoring elements 101 and 102 are connected by one voltage signal extraction portion 104v or the signal wire 114r. Thus, when, for example, poor connection is generated at the connection portion between the voltage signal extraction portion 104v and the board 105, it is not possible to monitor the cells S1 through Sn for overcharge or the like even if the two voltage monitoring elements 101 and 102 operate properly.

Thus, there is a need in the art to provide an electric tool battery in which even if poor connection or the like is generated in the wiring between one voltage monitoring element and the cells, it is possible to monitor the voltages of the cells by another voltage monitoring element, thereby achieving an improvement in terms of reliability against overcharge or the like of the electric tool battery.

SUMMARY OF THE INVENTION

According to one construction, there is provided an electric tool battery having a plurality of cells and a plurality of voltage monitoring elements capable of multiple monitoring of the voltages of the individual cells at the time of charging and discharging, and a lead plate connected to electrodes of the cells has a plurality of voltage signal extraction portions respectively corresponding to the plurality of voltage monitoring elements, with the voltage signal extraction portions and the voltage monitoring elements being respectively electrically connected to each other by different conductors.

According to the above construction, the voltage signal extraction portions formed on the lead plate and the voltage monitoring elements are respectively electrically connected to each other via different conductors. Thus, if poor connection or the like is generated in the wiring between one voltage monitoring element and a corresponding voltage signal extraction portion of the lead plate, it is possible to continuously execute the voltage monitoring of the cell by the other voltage monitoring element.

Thus, it is possible to achieve an improvement in terms of the reliability of the prevention structure against overcharge or the like of the electric tool battery.

According to another construction, the plurality of voltage monitoring elements monitoring the voltages of the individual cells can operate with different voltages.

According to another construction, there are provided a first voltage monitoring element and a second voltage monitoring element monitoring the voltages of the individual cells. The first voltage monitoring element and the second voltage monitoring element allow setting of an upper limit voltage respectively at the time of charging. When the voltages of the cells become higher than the upper limit set voltage, a voltage upper limit signal can be output. The upper limit set voltage of the second voltage monitoring element can be set larger than that of the first voltage monitoring element.

According to another construction, the first voltage monitoring element and the second voltage monitoring element can set a lower limit voltage at the time of discharging. When the voltages of the cells become lower than the lower limit set voltage, a voltage lower limit signal can be output. The lower limit set voltage of the second voltage monitoring element can be set larger than that of the first voltage monitoring element.

Thus, when, for example, the first and second voltage monitoring elements operate properly and the wirings thereof are not defective, the first voltage monitoring element firstly outputs a voltage upper limit signal, and then the second voltage monitoring element outputs a voltage upper limit signal. At the time of discharging, the second voltage monitoring element first outputs a voltage lower limit signal, and then the firstly voltage monitoring signal outputs a voltage lower limit signal.

Thus, it is possible to detect any failure of the voltage monitoring elements or defective wiring etc. by checking the order of operation of the first and second voltage monitoring elements at an early stage.

According to another construction, the upper limit set voltage of the second voltage monitoring element can be set lower than an upper limit charge voltage specific to the cells.

Thus, the second voltage monitoring element operates before the cells exceed the upper limit charge voltage specific to the cells, thereby preventing overcharge.

According to another construction, the voltage monitoring elements are mounted to a board, and the voltage signal extraction portion of the lead plate protrudes in the form of a band plate from the lead plate, with the distal end portion thereof being connected to a corresponding terminal of the board.

In this way, the lead plate extends to the position of the board, so that defective wiring is not easily generated.

According to another construction, the voltage monitoring elements are mounted to a board, and connection is effected by signal wires between the voltage signal extraction portion of the lead plate and the terminal of the board.

As a result, the configuration of the lead plate may not be complicated, and the lead plate can be easily shaped.

According to the above construction, even in a case where poor connection may be generated in the wiring between one voltage monitoring element and the cells, it is possible to monitor the voltages of the cells by another voltage monitoring element, so that it is possible to achieve an improvement in terms of the reliability of the electric tool battery against overcharge or the like.

DESCRIPTION OF THE PREFERRED EMBODIMENTS

Figure 1:
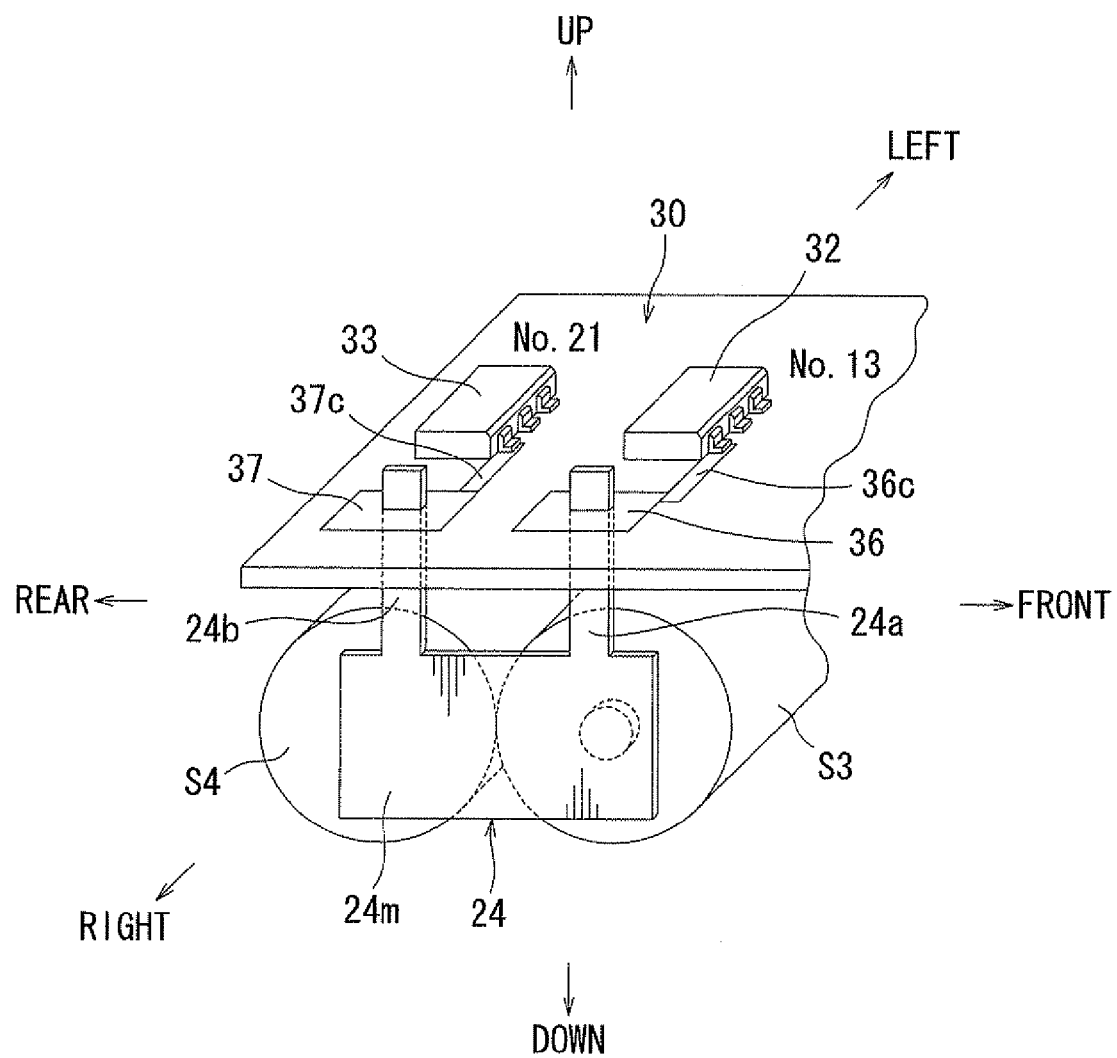
FIG. 1 is a schematic perspective view of the wiring structure of an electric tool battery according to one construction.

Each of the additional features and teachings disclosed above and below may be utilized separately or in conjunction with other features and teachings to provide improved electric tool battery. Representative examples of the present teaching, which examples utilize many of these additional features and teachings both separately and in conjunction with one another, will now be described in detail with reference to the attached drawings. This detailed description is merely intended to teach a person of skill in the art further details for practicing preferred aspects of the present teachings and is not intended to limit the scope of the invention. Only the claims define the scope of the claimed invention. Therefore, combinations of features and steps disclosed in the following detailed description may not be necessary to practice the invention in the broadest sense, and are instead taught merely to particularly describe representative examples of the invention. Moreover, various features of the representative examples and the dependent claims may be combined in ways that are not specifically enumerated in order to provide additional useful examples of the present teachings.

In the following, an electric tool battery 10 according to one construction will be described with reference to FIGS. 1 through 5. Here, the front, rear, right, left, upper, and lower sides in the drawings correspond to the front, rear, right, left, upper, and lower sides of the electric tool battery 10.

Figure 2:
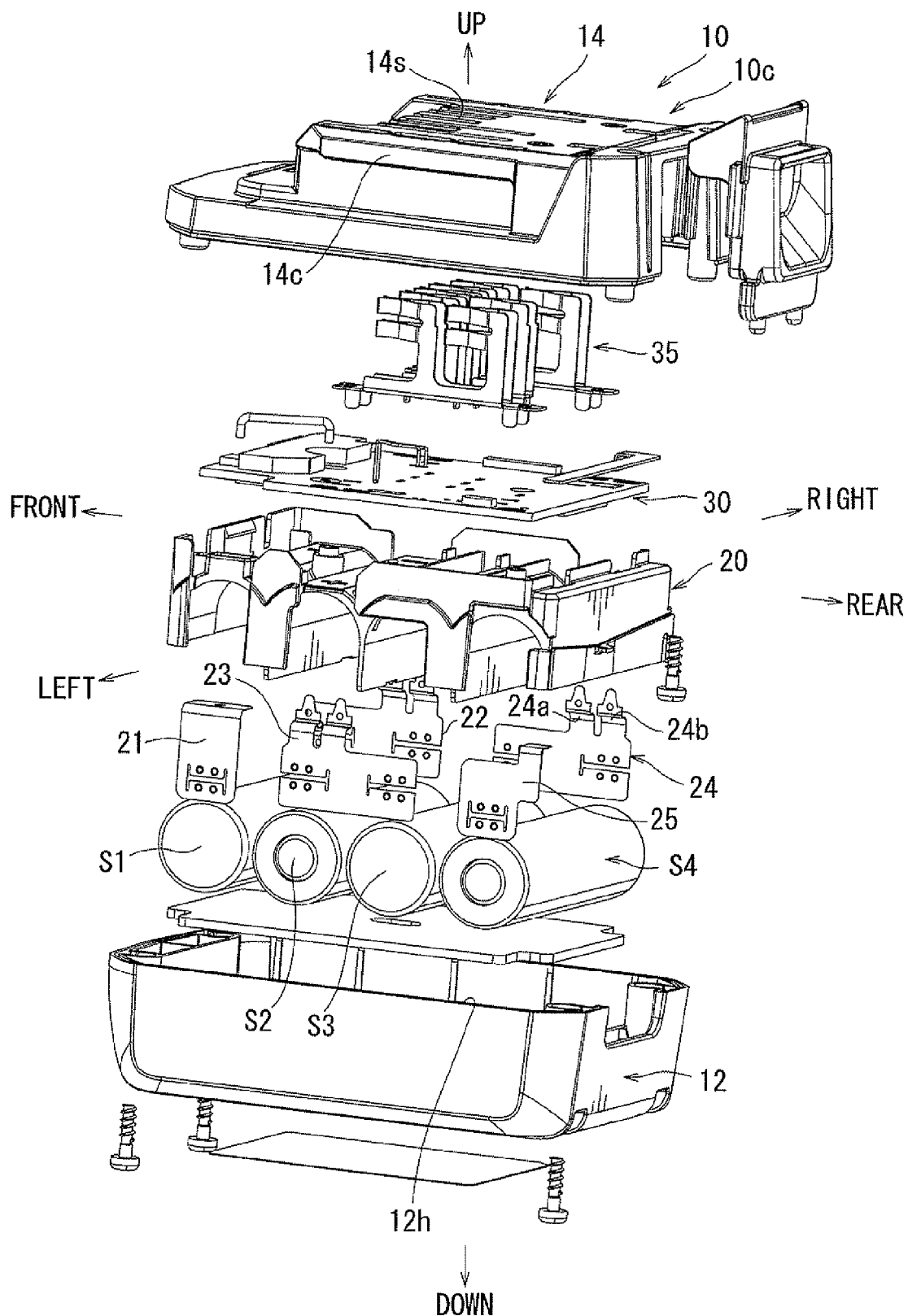
FIG. 2 is an exploded perspective view of the electric tool battery of one construction.

As shown in FIG. 2, the electric tool battery 10 is provided with a battery case 10c, which is composed of an open-top-type case main body portion 12 and a cover portion 14 covering an opening 32h of the case main body portion 12. Inside the case main body 12, four columnar cells S1 through S4 are arranged longitudinally, with their axes matched with the width direction (horizontal direction) of the case main body portion 12. A cell cover 20 for setting the four cells S1 through S4 in position within the case main body portion 12 is placed from above on the cells S1 through S4. Further, first through fifth lead plates 21, 22, 23, 24, and 25 for connecting the four cells S1 through S4 electrically in series are mounted to predetermined positions on the side surfaces of the cell cover 20. As shown in the circuit diagram of FIG. 3, the first lead plate 21 is connected to the negative electrode of the cell S1, and the second lead plate 22 is connected to the positive electrode of the cell S1 and the negative electrode of the cell S2. Further, the third lead plate 23 is connected to the positive electrode of the cell S2 and the negative electrode of the cell S2, and the fourth lead plate 24 is connected to the positive electrode of the cell S3 and the negative electrode of the cell S4. And, the fifth lead plate 25 is connected to the positive electrode of the cell S4.

Figure 3:
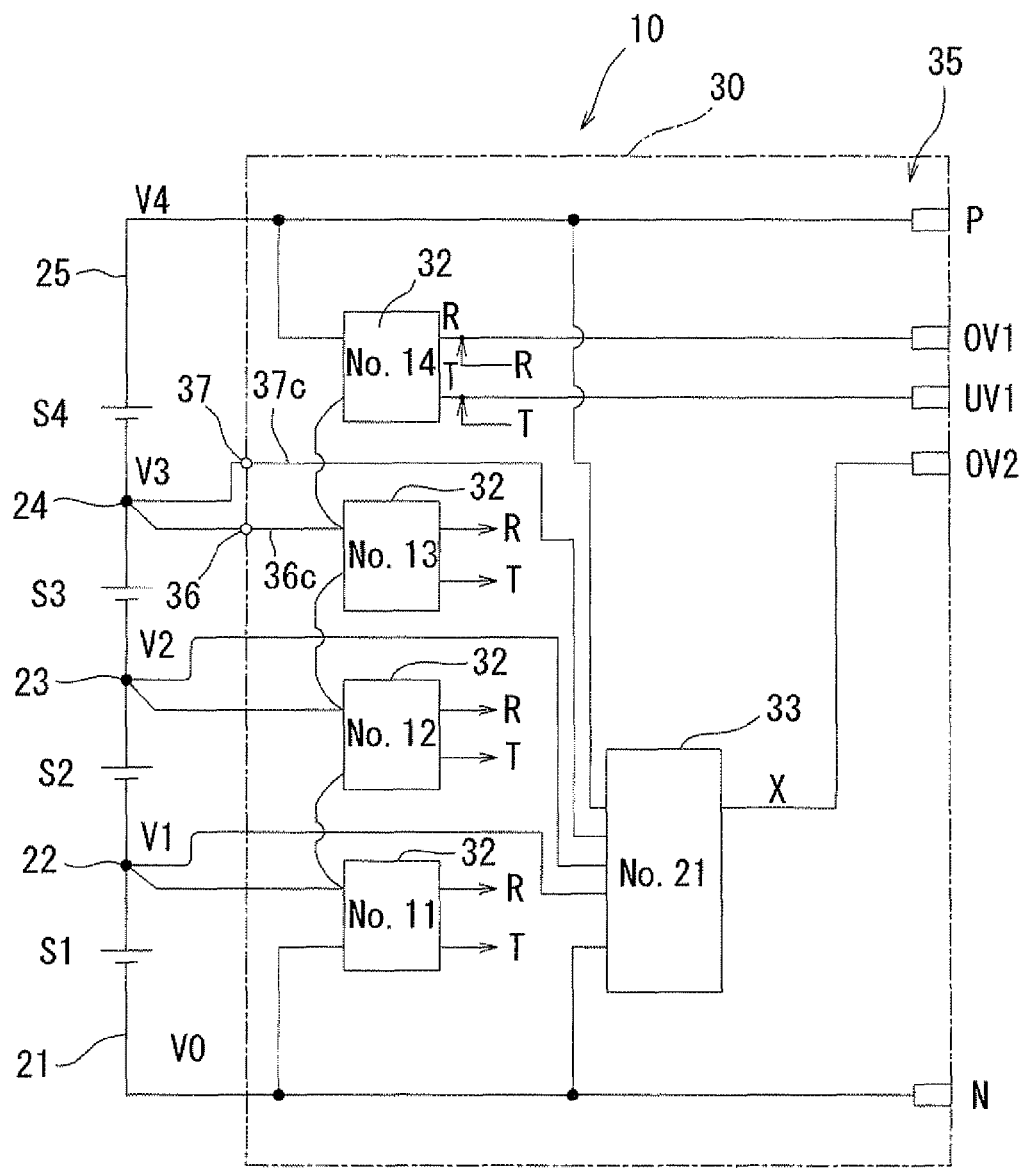
FIG. 3 is a circuit diagram showing how the cell voltage is monitored in the electric tool battery.

As shown in FIG. 2, on the upper side of the cell cover 20, there is arranged a board 30 of the electric circuit of the electric tool battery 10. As shown in FIG. 3, the board 30 is provided with No. 11 to No. 14 voltage monitoring elements 32 monitoring the voltages of the cells S1 through S4, a No. 21 voltage monitoring element 33, and a temperature detection circuit (not shown) for the cells S1 through S4, etc. Further, as shown in FIG. 2, mounted to the board 30 is a battery terminal 35 to which an electric tool terminal (not shown) or a charger terminal (not shown) is connected. As shown in FIG. 3, the battery terminal 35 is composed of, for example, a positive terminal P, a negative terminal N, voltage upper limit signal terminals OV1 and OV2, and a voltage lower limit signal terminal UV1 of the electric tool battery 10.

As shown in FIG. 2, formed on the cover portion 14 of the battery case 10c are a pair of right and left rail portions 14c configured to be capable of being connected to an electric tool connection portion (not shown) or a charger connection portion (not shown). Further, between the rail portions 14c, there are formed a plurality of guide slits 14s guiding the electric tool terminal (not shown) or the charger terminal (not shown) to the battery terminal 35.

As shown in FIG. 3, the No. 11 to No. 14 voltage monitoring elements 32 are ICs respectively monitoring the voltages of the corresponding cells S1 through S4. When the voltages of the cells S1 through S4 become higher than an upper limit set voltage OV1 at the time of charging, they can output a voltage upper limit signal R. When the electric tool battery 10 is used in an electric tool (at the time of discharging) and the voltages of the cells S1 through S4 become lower than a lower limit set voltage UV1, they can output a voltage lower limit signal T.

The No. 21 voltage monitoring element 33 is an IC monitoring the voltage of each of the corresponding cells S1 through S4 in parallel with the No. 11 to No. 14 voltage monitoring elements 32. That is, as shown in FIG. 3, the No. 21 voltage monitoring element 33 can monitor the respective voltages of the cells S1, S2, S3, and S4. Further, when the voltages of the cells S1 through S4 become higher than an upper limit set voltage OV2 at the time of charging, it can output a voltage upper limit signal X.

The upper limit set voltage OV2 of the No. 21 voltage monitoring element 33 can be set to a value smaller than the upper limit charge voltage specific to the cells, e.g., 4.2 V. The upper limit set voltage OV1 of the No. 11 to No. 14 voltage monitoring elements 32 can be set, for example, to 4.1 V, and the lower limit set voltage UV1 thereof can be set, for example, to 1.5 V. Further, the upper limit set voltage OV1 of the No. 11 to No. 14 voltage monitoring elements 32 can be set to the voltage to which the cells S1 through S4 are fully charged.

The No. 11 to No. 14 voltage monitoring elements 32 correspond to the first voltage monitoring element, and the No. 21 voltage monitoring element 33 corresponds to the second voltage monitoring element of one construction.

Figure 4:
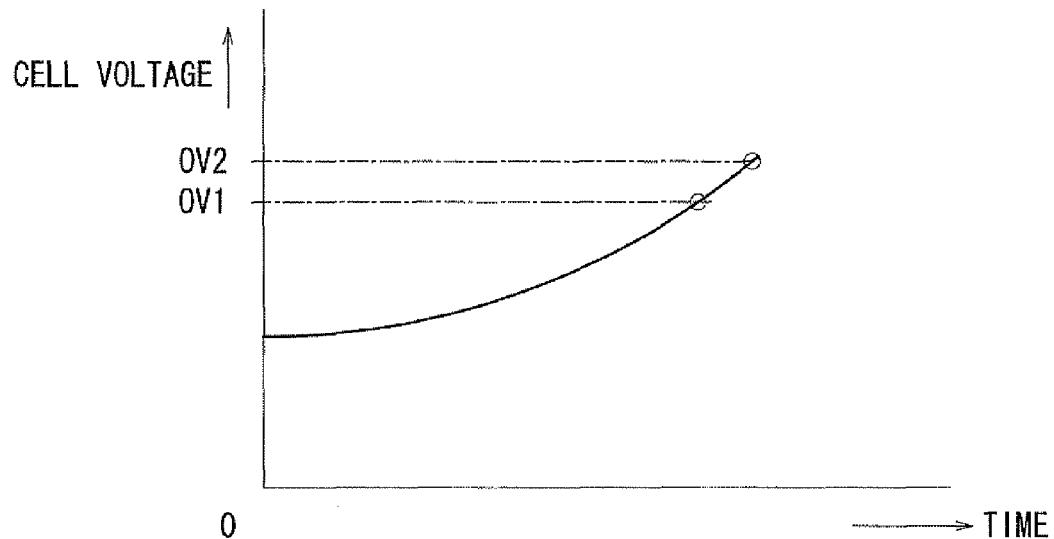
FIG. 4 is a graph showing the operation of voltage monitoring elements at the time of charging and discharging of the electric tool battery.
Figure 4:
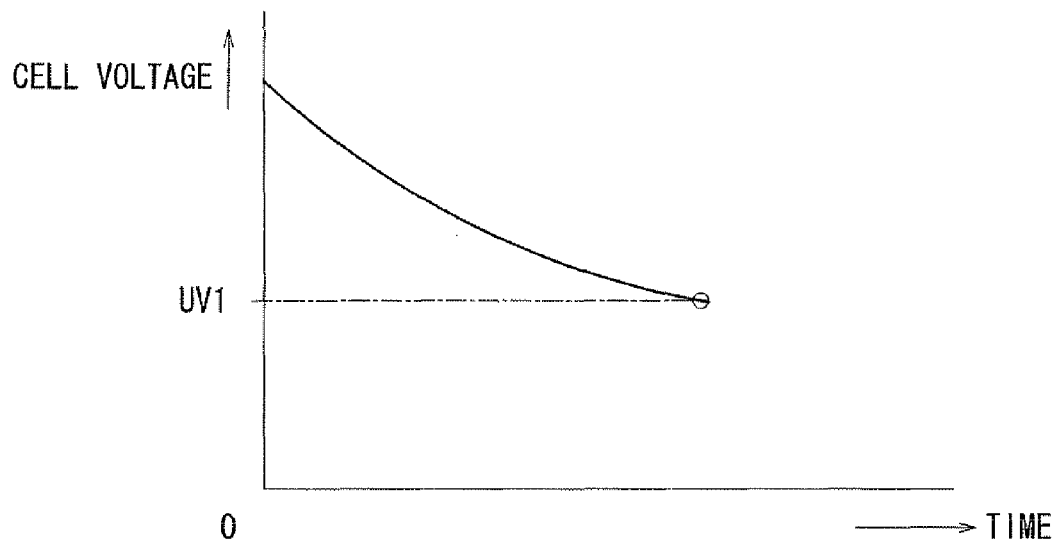

Thus, as shown in FIG. 4, when the voltages of the cells S1 through S4 increase to exceed the upper limit set voltage OV1 at the time of charging the electric tool battery 10, the No. 11 to No. 14 voltage monitoring elements 32 firstly output the voltage upper limit signal R. As a result, it can be seen that the cells S1 through S4 have been fully charged. Then, the charger receives the upper limit set voltage OV1 to complete the charging. However, if the charging is continued due to some kind of failure and the voltages of the cells S1 through S4 exceed the upper limit set voltage OV2, the No. 21 voltage monitoring element 33 outputs the voltage upper limit signal X. As a result, it can be seen that the cells S1 through S4 are immediately before overcharging. Then, the charger receives the voltage upper limit signal X to complete the charging.

It is also possible to complete the charging when the voltages of the cells S1 through S4 exceed the upper limit set voltage OV1, or when the charger has made full charge detection, or when the voltages of the cells S1 through S4 exceed the upper limit set voltage OV2.

Further, when the electric tool battery 10 is used in an electric tool, that is, during discharge, and the voltages of the cells S1 through S4 become lower than the lower limit set voltage UV1, the No. 11 to No. 14 voltage monitoring elements 32 output the voltage lower limit signal T. As a result, the electric tool receives the voltage lower limit signal T to stop the motor.

Next, with reference to the schematic diagram of FIG. 1, the wiring structure between the voltage monitoring elements 32 and 33 and the cells S1 through S4 will be described. FIG. 1 shows, by way of example, the wiring structure for guiding the voltage V3 (See FIG. 3) of the connection portion between the positive electrode of the cell S3 and the negative electrode of the cell S4, that is, the voltage V3 of the fourth lead plate 24, to the No. 13 voltage monitoring element 32 and the No. 21 voltage monitoring element 33.

As shown in FIGS. 1 and 2, the fourth lead plate 24 is composed of a laterally elongated, substantially rectangular lead plate main body portion 24m, and a first voltage signal extraction portion 24m and a second voltage signal extraction portion 24b, which are both in the form of a band plate, upwardly protruding from the upper side of the lead plate main body portion 24m. And, the positive electrode of the cell S3 and the negative electrode of the cell S4 are connected to the lead plate main body portion 24m. The distal end portions (upper end portions) of the first voltage signal extraction portion 24a and the second voltage signal extraction portion 24b are respectively connected to a first terminal 36 and a second terminal 37 formed on the board 30. And, the first terminal 36 is connected to the input terminal of the No. 13 voltage monitoring element 32 via a conductor 36e printed on the board 30. Further, the second terminal 37 is connected to the input terminal of the No. 21 voltage monitoring element 32 via a conductor 37c that is also printed on the board 30.

Due to the above construction, even when, in FIG. 1, there is generated with time poor connection at the connection portion between the first voltage signal extraction portion 24a of the fourth lead plate 24 and the first terminal 36 of the board 30, the voltage V3 of the fourth lead plate 24 is guided to the No. 21 voltage monitoring element 33 via the second terminal 37. That is, it is possible to monitor the voltage V3 of the fourth lead plate 24 by the No. 21 voltage monitoring element 33.

As a result, the possibility that both the No. 13 voltage monitoring element 32 and the No. 21 voltage monitoring element 33 become unusable due to poor connection or the like in the wiring is substantially reduced, and it is possible to achieve an improvement in terms of the reliability of the overcharge and overdischarge prevention structure of the electric tool battery 10.

The wiring structure for guiding the voltage V2 of the third lead plate 23 to the No. 12 voltage monitoring element 32 and the No. 21 voltage monitoring element 33, and the wiring structure for guiding the voltage V1 of the second lead plate 22 to the No. 11 voltage monitoring element 32 and the No. 21 voltage monitoring element 33, are of the same structure as described above. The voltage V4 of the positive electrode of the cell S4 and the voltage V0 of the negative electrode of the cell S1 are guided to the No. 11 and No. 14 voltage monitoring elements 32 and the No. 21 voltage monitoring element 33 via conductors (not shown) printed on the board 30.

In the electric tool battery 10 of one construction, the voltage signal extraction portions 24a and 24b formed on the lead plate 24 and the voltage monitoring elements 32 and 33 are respectively electrically connected to each other via the separate conductors 36, 37. Thus, even if poor connection is generated in the wiring between one voltage monitoring element 32 and the corresponding voltage signal extraction portion 24a of the lead plate 24, it is possible to continuously execute the voltage monitoring by the other voltage monitoring element 33.

Thus, it is possible to reliably prevent overcharge etc. of the electric tool battery 10, thereby achieving an improvement in terms of reliability.

The upper limit set voltage OV2 of the No. 21 voltage monitoring element 33 (the second voltage monitoring element 33) is set to a value larger than the upper limit set voltage OV1 of the No. 11 to No. 14 voltage monitoring elements 32 (the first voltage monitoring elements 32). Thus, it is possible to find out at an early stage any failure or poor connection etc. in the voltage monitoring elements 32 and 33 by checking the order of operation of the first voltage monitoring elements 32 and the second voltage monitoring element 33 at the time of charging or discharging.

The upper limit set voltage OV2 of the No. 21 voltage monitoring element 33 (the second voltage monitoring element 33) is set to a value lower than the upper limit charge voltages of the cells S1 through S4, so that even if charge is continued due to some failure, it is possible to detect that the cells S1 through S4 are about to exceed the upper limit voltage, thus preventing overcharge.

Further, the first voltage monitoring elements 32 and the second voltage monitoring element 33 are mounted to the board 30, and the voltage signal extraction portions 24a and 24b of the lead plate 24 protrude from the lead plate 24 in the form of a band plate, with their distal end portions being connected to the corresponding terminals 36 and 37 of the board 30. In this way, the lead plate 24 is extended to the position of the board 30, so that poor connection is not easily generated.

Figure 5:
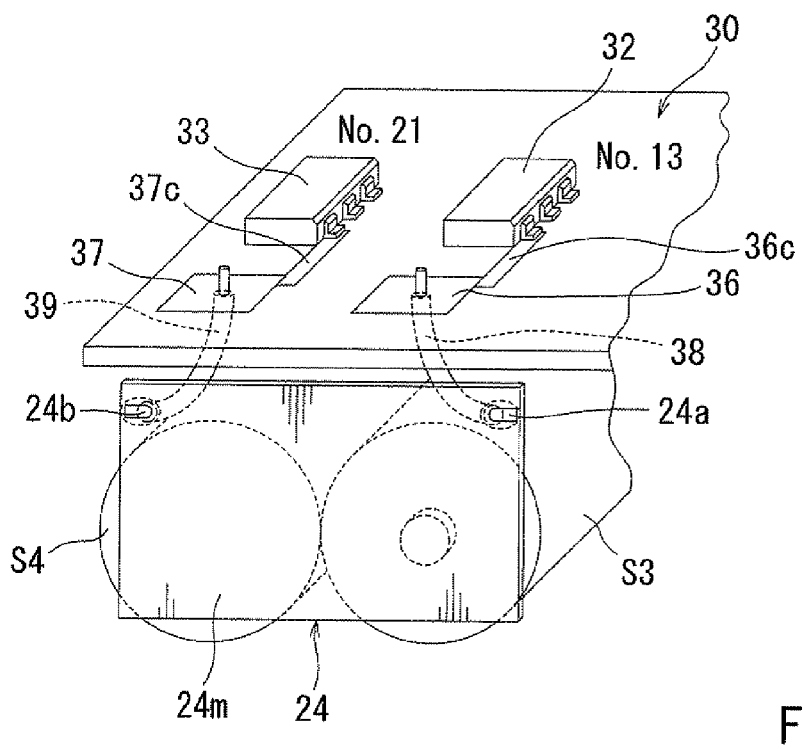
FIG. 5 is a schematic perspective view of the wiring structure of an electric tool battery according to another construction.
Figure 6:
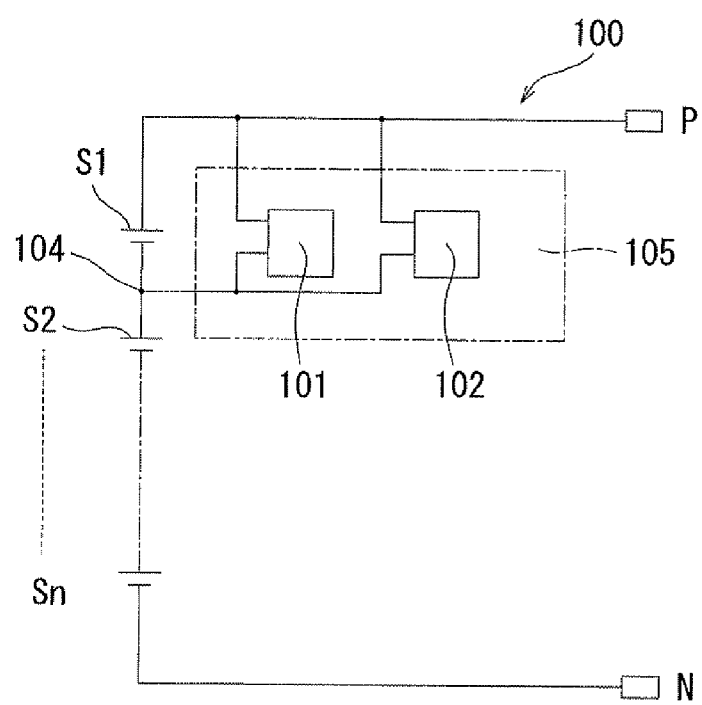
FIG. 6 is a schematic circuit diagram showing how the cell voltage is monitored in a known electric tool battery.
Figure 7:
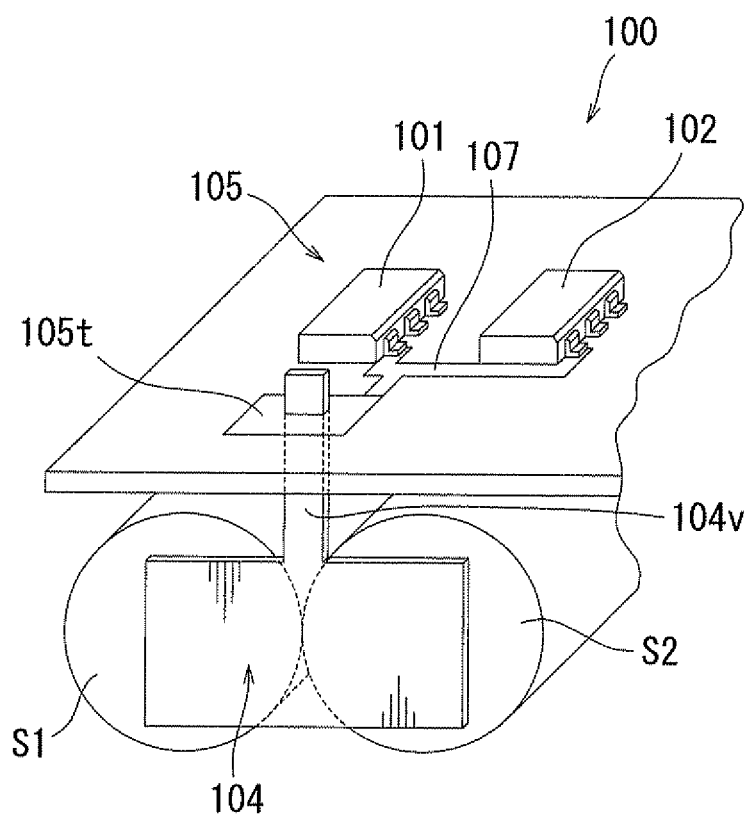
FIG. 7 is a perspective view of the wiring structure of a known electric tool battery.
Figure 8:
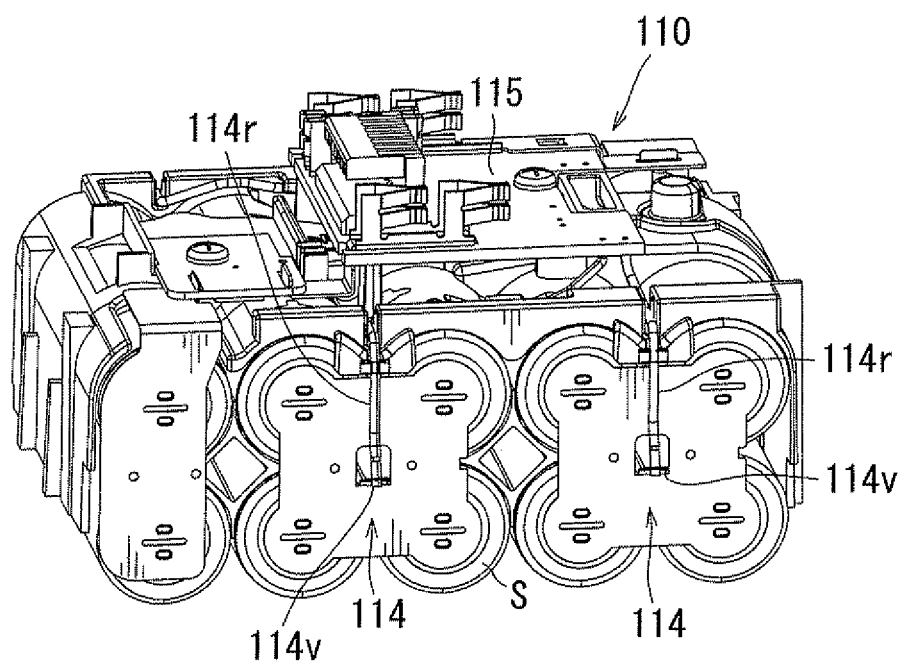
FIG. 8 is a schematic perspective view of the wiring structure of a known electric tool battery.

The present invention is not restricted to the above construction, but allows modifications without departing from the spirit and scope of the present invention. For example, as shown in FIG. 1 in the above-described example of the present invention, the voltage signal extraction portions 24a and 24b protrude upwardly from the upper side of the lead plate main body portion 24m in the form of a band plate, and the distal ends of their voltage signal extraction portions 24a and 24b are connected to the terminals 36 and 37 of the board 30. However, as shown in FIG. 5, it is also possible to adopt a construction in which the voltage signal extraction portions 24a and 24b are provided at one end side and the other end side of the upper side of the lead plate main body portion 24m, with their voltage signal extraction portions 24a and 24b and the terminals 36 and 37 of the board 30 being connected to each other by signal wires 38 and 39. In this way, by using the signal wires 38 and 39, the configuration of the lead plate 24 may not be complicated, and the lead plate can be easily shaped.

Further, in the above construction the lower limit set voltage UV1 is set for only the No. 11 to No. 14 voltage monitoring elements 32, but it is also possible to set lower limit set voltages for both the No. 11 to No. 14 voltage monitoring elements 32 and the No. 21 voltage monitoring element 33. In this case, it is desirable that the value of the lower limit set voltage UV1 of the No. 11 to No. 14 voltage monitoring elements 32 should be set to be different from the value of the lower limit set voltage UV2 of the No. 21 voltage monitoring element 33. As a result, it is possible to find out at an early stage any failure or defective wiring etc. in the voltage monitoring elements 32 and 33 by checking the order of operation of the No. 11 to No. 14 voltage monitoring elements 32 and the No. 21 voltage monitoring element 33 at the time of discharging.

Further, in the above construction described above the voltages of the cells S1 through S4 are monitored by the No. 11 to No. 14 voltage monitoring elements 32, but it is also possible, for example, for one voltage monitoring element to monitor the voltages of the cells S1 through S4. Further, it is also possible to divide the No. 21 voltage monitoring element 33 into a plurality of portions.

Further, it is also possible to adopt a construction in which, when the voltages of the cells S1 through S4 increase at the time of charging to exceed the upper limit set voltage OV2 of the No. 21 voltage monitoring element 33 (i.e., when the voltage monitoring element 33 operates), a record showing the excess of the cell voltages over the upper limit can be kept in the electric tool battery 10. Further, it is also possible to adopt a construction in which, when the voltages of the cells S1 through S4 decrease at the time of discharging to drop the lower limit set voltage UV1 of the voltage monitoring element 32, a record showing the drop of the cell voltages under the lower limit can be kept in the electric tool battery 10. In this way, a failure analysis in the electric tool battery can be made afterwards.

We claim:

1. An electric tool battery, comprising:
a plurality of cells;
a lead plate that is connected to electrodes of the cells; and
a plurality of voltage monitoring elements capable of multiple monitoring of the voltages of the individual cells at the time of charging and discharging;
wherein the lead plate has a plurality of voltage signal extraction portions respectively corresponding to the plurality of voltage monitoring elements,
wherein the voltage signal extraction portions and the voltage monitoring elements are electrically connected to each other respectively via different conductors,
wherein the plurality of voltage monitoring elements comprises a first monitoring element and a second voltage monitoring element electrically connected in parallel to the first voltage monitoring element and operable independently from the first voltage monitoring element;
the first voltage monitoring element and the second voltage monitoring element respectively allow setting of an upper limit set voltage at the time of charging, such that when the voltage of the cells become higher than the upper limit set voltage, the first voltage monitoring element and/or the second voltage monitoring element output a voltage upper limit signal; and
the upper limit set voltage of the second voltage monitoring element is set larger than the upper limit set voltage of the first voltage monitoring element.

2. The electric tool battery according to claim 1, wherein the plurality of voltage monitoring elements monitoring the voltages of the individual cells operate with different upper limit set voltages.

3. The electric tool battery according to claim 1, wherein:
the first voltage monitoring element and the second voltage monitoring element respectively allow setting of a lower limit voltage at the time of discharging, such that when the voltages of the cells become lower than the lower limit set voltage, the first voltage monitoring element and/or the second voltage monitoring element output a voltage lower limit signal; and
wherein the lower limit set voltage of the second voltage monitoring element is set larger than the lower limit set voltage of the first voltage monitoring element.

4. The electric tool battery according to claim 1, wherein the upper limit set voltage of the second voltage monitoring element is set to a voltage lower than an upper limit charge voltage specific to the cells.

5. The electric tool battery according to claim 1, wherein:
the voltage monitoring elements are mounted to a board; and
wherein the voltage signal extraction portion of the lead plate protrudes from the lead plate in the form of a band plate, with the distal end portion thereof being connected to a corresponding terminal of the board.

6. The electric tool battery according to claim 1, wherein:
the voltage monitoring elements are mounted to a board; and
wherein connection between the voltage signal extraction portion of the lead plate and the corresponding terminal of the board is effected by a signal wire.

7. The electric tool battery according to claim 1, wherein when the second voltage monitoring element outputs the voltage upper limit signal, a record showing the excess of the cell voltage over the upper limit is kept in the electric tool battery.

8. The electric tool battery according to claim 3, wherein when the first voltage monitoring element outputs a voltage lower limit signal, a record showing the drop of the cell voltage below the lower limit is kept in the electric tool battery.

* * * * *